United States Patent [19]

Gray et al.

[11] Patent Number: 4,879,140

[45] Date of Patent: Nov. 7, 1989

[54] METHOD FOR MAKING PIGMENT FLAKES

[75] Inventors: Howard R. Gray, Sebastopol; Richard P. Shimshock; Matthew E. Krisl, both of Santa Rosa, all of Calif.

[73] Assignee: Deposition Sciences, Inc., Santa Rosa, Calif.

[21] Appl. No.: 274,380

[22] Filed: Nov. 21, 1988

[51] Int. Cl.$^4$ .............................................. B05D 3/06
[52] U.S. Cl. ..................................... 427/38; 427/237; 427/238; 427/248.1; 427/255; 427/294; 427/348; 427/371; 427/272
[58] Field of Search ............. 427/38, 237, 238, 248.1, 427/255, 272.5, 294, 348, 371

[56] References Cited

U.S. PATENT DOCUMENTS

| | | | |
|---|---|---|---|
| 2,713,004 | 7/1955 | Greenstein | 106/193 |
| 3,008,844 | 11/1961 | Grunin | 106/193 |
| 3,087,828 | 4/1963 | Linton | 106/291 |
| 3,123,489 | 3/1964 | Bolomey et al. | 106/291 |
| 3,123,490 | 3/1964 | Bolomey et al. | 106/291 |
| 3,374,105 | 3/1968 | Bolomey | 106/291 |
| 4,145,456 | 3/1979 | Kuppers et al. | 427/38 |
| 4,434,010 | 2/1984 | Ash | 106/291 |
| 4,565,618 | 1/1986 | Banks | 427/38 X |

OTHER PUBLICATIONS

Chaker et al., *J. Phys. Letters*, 53 L.71 (1982).
Marec et al., "Elec. Breakdown and Discharges in Gases", Plenum Pub. Corp. B,347 (1983).

*Primary Examiner*—Bernard Pianalto
*Attorney, Agent, or Firm*—Limbach, Limbach & Sutton

[57] ABSTRACT

A method for producing pigment flakes in the shape of thin plates. A chamber is provided which is placed under vacuum and a gas, which is capable of forming a plasma upon its exposure to a plasma generating device, was fed to the interior of the chamber device. The plasma is created within the chamber which forms a film upon a surface within the chamber. The film is converted to flakes which are then removed from the interior of the chamber.

22 Claims, 5 Drawing Sheets

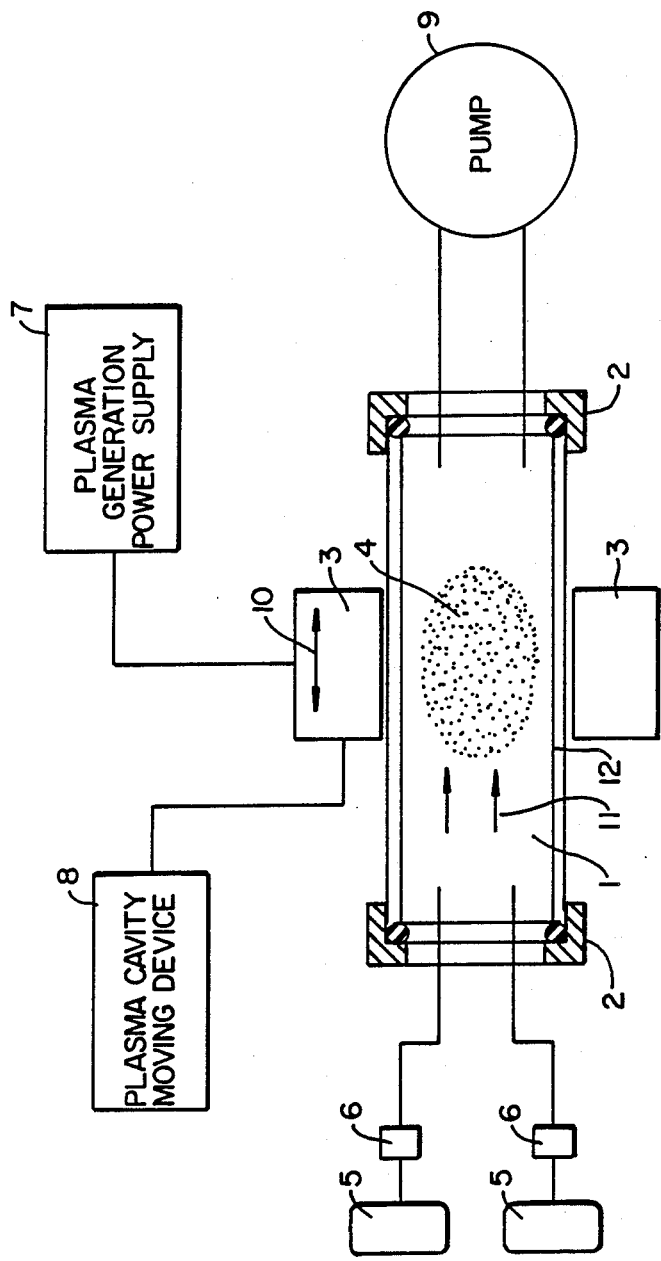
FIG._1.

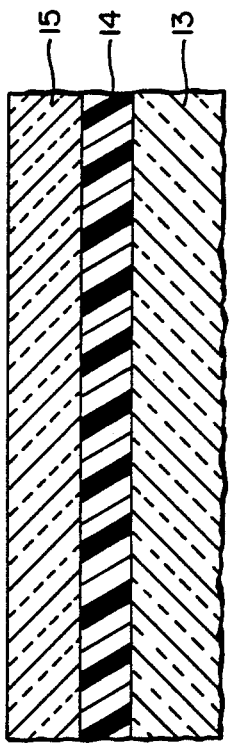
FIG._2.
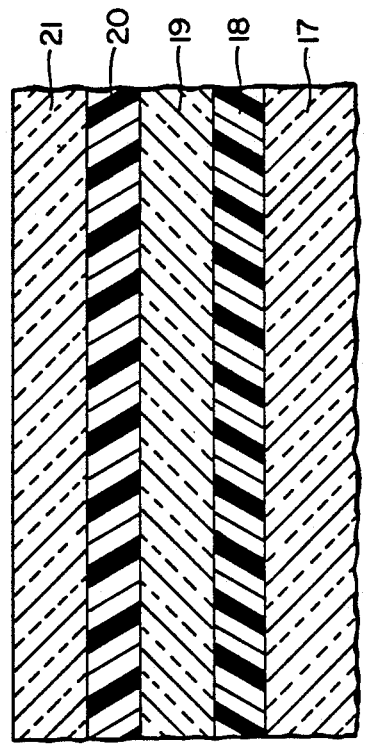
FIG._3.

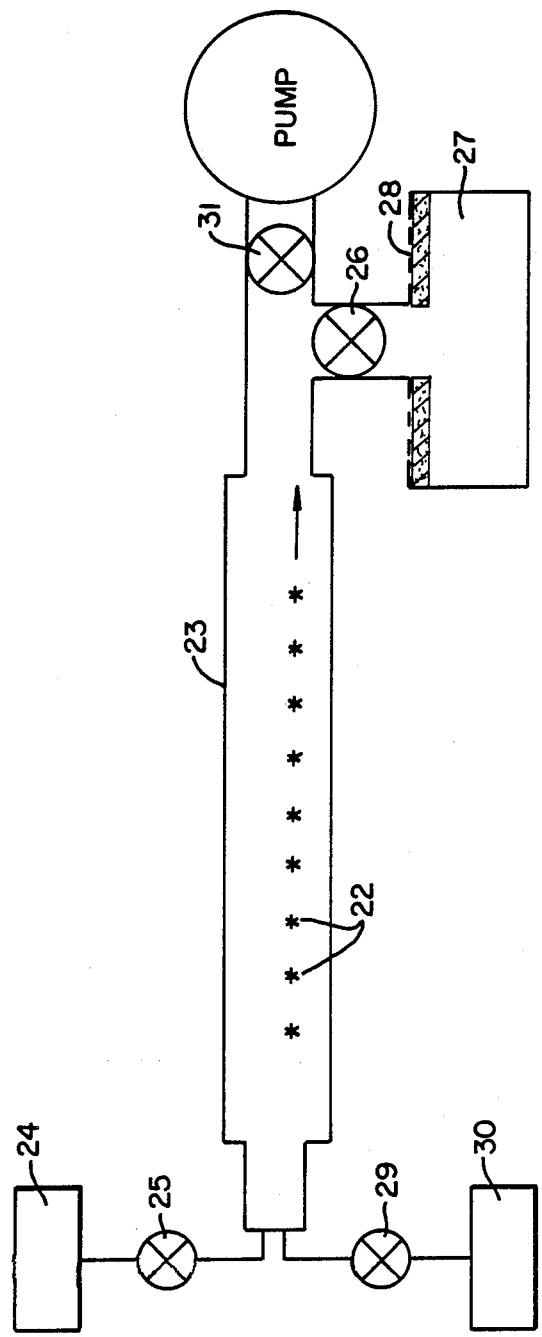
FIG._4.

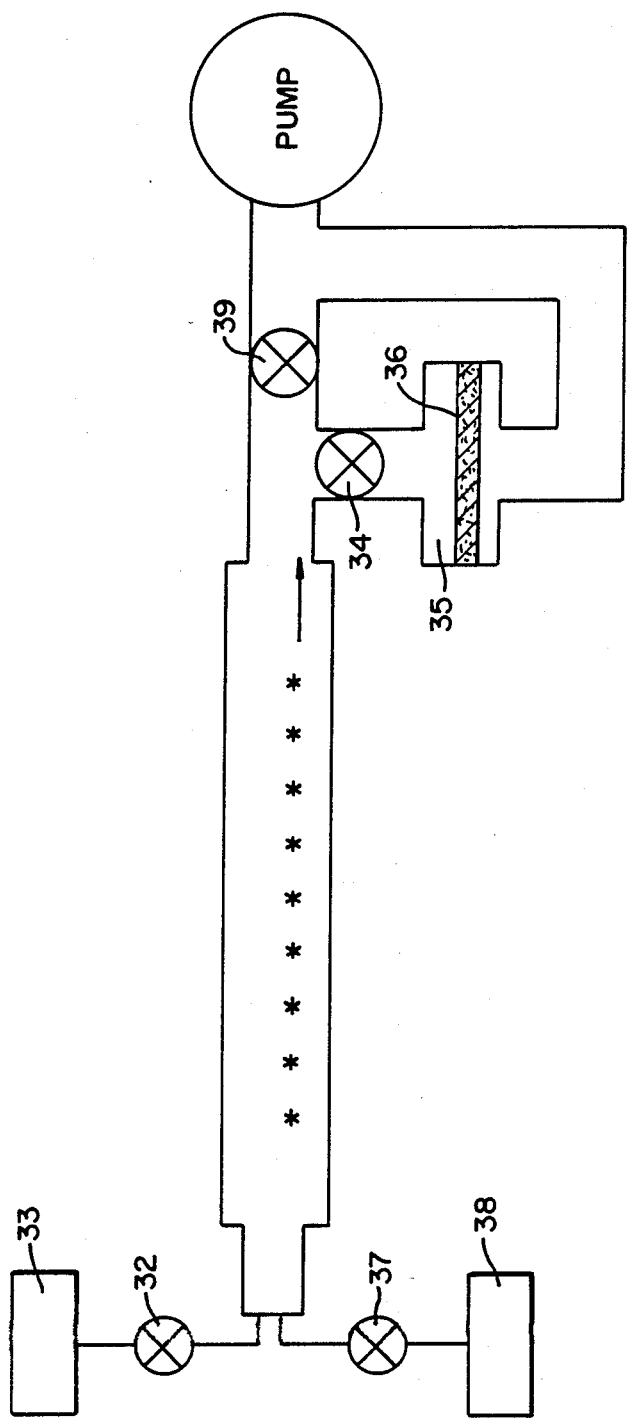
FIG._5.

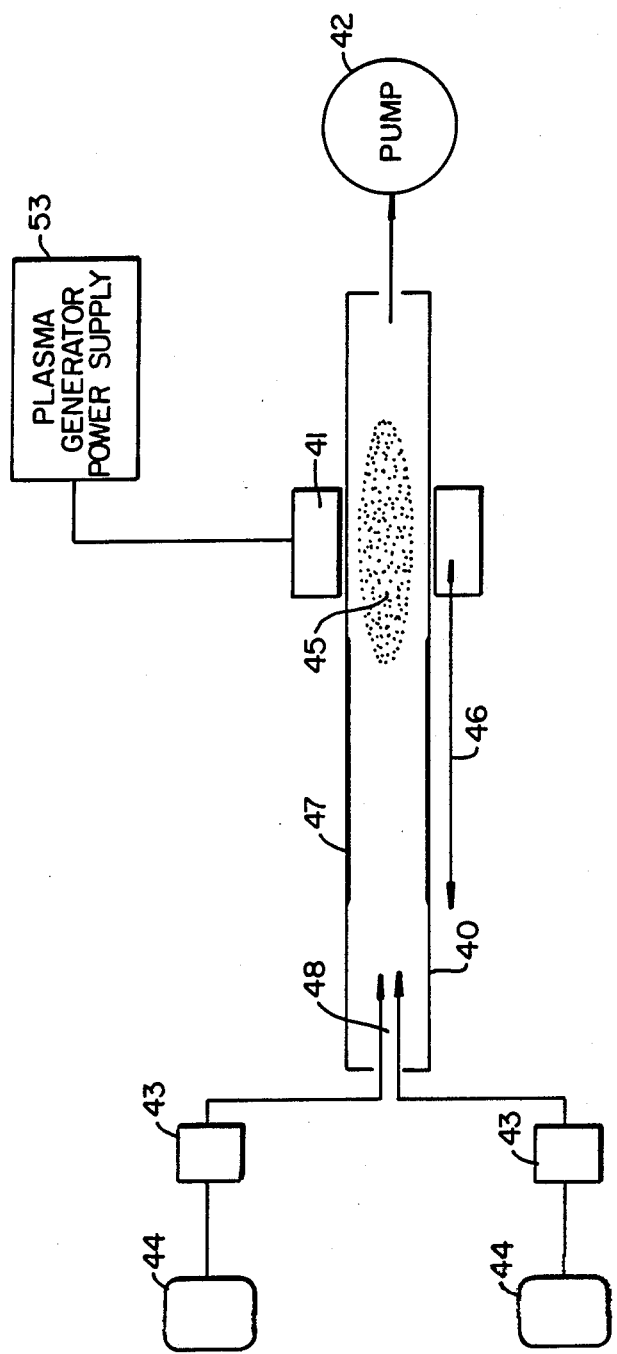
FIG._6.

METHOD FOR MAKING PIGMENT FLAKES

TECHNICAL DESCRIPTION OF THE INVENTION

The present invention relates to the production of pigment flakes produced from vacuum deposited thin films. Flakes of this nature, which are capable of the reflection, transmission and absorption of light when incorporated in a binder, are produced through the use of plasma chemical vapor deposition techniques.

BACKGROUND OF THE INVENTION

As noted above, flake pigments are substances which affect the reflection, transmission and absorption of light when incorporated in a binder and applied to a surface. These flakes are in the shape of thin plates having a nominal thickness from approximately 50 angstroms to 300 microns and generally possess diameters from several to several hundred microns. As taught in U.S. Pat. No. 3,123,490 to Bolomey et al., the disclosure of which is hereby incorporated by reference, these plates can be composed of either a single material or two or more materials arranged in layers.

When flake pigments are incorporated in a binder and applied to a surface, the flakes tend to lie parallel to one another and to the surface. If the flake index of refraction differs from that of the binder, light is reflected at the binder-flake interface which can provide a nacreous pearlescent luster as again taught by Bolomey et al. When the flakes are composed of multilayer films, with the index of refraction changing from layer to layer in accordance with well known techniques for designing thin film interference structures, the spectral character of their reflectivity can be controlled. Furthermore, the reflection changes spectrally as the viewing angle is changed. Thus, the surface might appear red when viewed at normal incidence and blue when viewed at, for example, an angle 45° from normal. For example, Bolomey et al. teaches using such pigment flakes to simulate pearl buttons by incorporating the flakes in a polymethylmethacrylate binder and by applying the resulting lacquer to glass beads to simulate natural pearls.

Pigment flakes can also be employed in the production of anti-counterfeiting inks or coatings. In such an environment, multi-layered pigment flakes are incorporated in a binder and the mixture used as an ink. The color of the ink is determined by the thicknesses, number, and indices of refraction of the layers in the flake structure. Obviously, color change as the viewing angle changes and this characteristic can be used to authenticate articles ranging from currency to blue jeans.

Previously, pigment flakes have been produced employing vacuum evaporation techniques. Such techniques can be employed to both deposit a film and to aid in removal of the film from a substrate in flake form. For example, Bolomey et al. teaches the use of an endless belt of 25 mil thick polyester film mounted on two parallel horizontal rollers in a vacuum chamber. This belt moves serially over four boats loaded with $Na_2B_4O_7$, $ZnS$, $MgF_2$, and $ZnS$, respectively. As a specific section of the belt moves over a particular boat containing one of the above-enumerated compounds, it is coated with a layer of the material in that boat resulting in a $ZnS/MgF_2/ZnS$ interference coating on top of a $Na_2B_4O_7$ layer which is to act as a release layer. The thickness of the flake layers can be adjusted to yield the desired reflectance and transmittance spectra.

After the coating of Bolomey et al. is applied and the coating and its substrate brought to atmospheric pressure, the belt is removed from the vacuum coater and washed with water which dissolves the release layer and releases the film from the polyester belt as flakes. These flakes are washed to remove the release layer and are then filtered and dried.

Yet another technique for making pigment flakes is taught by Ash et al. in U.S. Pat. No. 4,434,010. In this instance, an interference film is coated on a polyethylene substrate in a large vacuum chamber. After removal from the chamber, the film is removed in flake form by dissolving the substrate in acetone or some other suitable solvent. Again, the flakes must be filtered and dried.

It is quite evident from a consideration of the techniques taught by Bolomey et al. and Ash et al. that the production of pigment flakes in large quantities is a formidable task requiring large, expensive vacuum equipment and further requiring the removal of the pigmented film from its substrate by a wet process carried out outside the vacuum chamber. As such, it is evident that the vacuum chamber must first be subjected to low pressure, the film deposited on a substrate followed by venting the chamber to ambient conditions, whereupon the substrate must be exposed to either acetone or similar solvent for the release layer necessitating a further filtering and drying process to remove the flakes from the dissolving medium.

The speed of prior art processes is obviously limited by a number of factors. These include the mass of flake producing material which can be deposited in a given time in a roll coater which is in turn governed by the web speed and thicknesses of the layers comprising the flakes. Using Bolomey et al. as an example, employing a substrate width of 1 foot and deposition rates as provided by Bolomey et al., mass deposition of 0.1 to 0.2 gm/min can be expected. Employing a webbing width of 5 feet, which is typical of a very large roll coater, the rate only becomes 0.5 to 1 gm/min. An examination of the prior art, generally, indicates that such rates are typical for the vacuum roll coaters depositing dielectrics in a fashion which allows good thickness control.

It is thus an object of the present invention to provide pigment flake material while avoiding the disadvantages inherent in practicing those prior art methods described above.

It is yet another object of the present invention to produce pigment film material at a relatively high rate using inexpensive equipment.

It is still a further object of the present invention to provide an efficient method for removing thin film material in the form of flakes from a substrate on which it was deposited.

BRIEF DESCRIPTION OF THE DRAWINGS

These and further objects will be more readily appreciated when considering the following disclosure and appended drawings in which:

FIG. 1 is a schematic view of a plasma chemical vapor deposition system which can be used to deposit thin film multilayers on the inside of dielectric tubes in accordance with the present invention;

FIG. 2 is a cross-sectional side view of a multilayer film deposited on top of a release layer in accordance with the present invention.

FIG. 3 is a cross-sectional side view of several multi-layered stacks separated by release layers;

FIG. 4 is a schematic view of a high pressure system which can be used to remove pigment flakes from the inside of a tube after they have been freed from the tube walls on which they were deposited;

FIG. 4 is a schematic view of a low pressure system for removing pigment flakes from the inside of a tube; and FIG. 6 is yet another embodiment of the plasma chemical vapor deposition system of the present invention.

The present invention involves a method for producing pigments in the shape of thin platelets. The method comprises providing a chamber and creating a vacuum within the chamber, followed by feeding gases into the chamber, said gases being capable of forming a plasma when exposed to a plasma generating device. A plasma is then created within the chamber and a film is formed on the chamber wall. Said film is then removed from the chamber wall as flakes and extracted from the chamber.

The plasma referred to previously is created by bringing the chamber within a microwave or rf cavity. The cavity can remain stationary, and the chamber moved within the cavity or, alternatively, the cavity can be moved relative to the stationary chamber. In other embodiments of the invention both the chamber and the cavity remain stationary while the plasma is moved electrically in the chamber or pulsed on and off.

The chamber in which the deposition takes place is usually, but not necessarily, a cylindrical tube. Furthermore, the deposition can be done on a substrate inside the chamber and not on the chamber walls per se.

DETAILED DESCRIPTION OF THE INVENTION

As previously noted, the present invention uses the principles of plasma chemical vapor deposition to deposit this films on the inside wall of a tube or on a dielectric surface inside the tube at relatively high mass deposition rates. In one embodiment, the present invention also provides for removal of the films in flake form without removal of the tube or dielectric surface from the vacuum system in which the plasma chemical vapor deposition takes place. As such, flakes are produced at high rates employing relatively inexpensive equipment and without the need for a flake removal process outside the vacuum chamber.

In one embodiment of the invention, film deposition takes place on the inside wall of a glass tube, normally 0.5 to 2 inches in diameter. The tube is passed through a microwave cavity and evacuated whereupon precursor gases are bled through the glass tube. A plasma is then struck inside the tube in the region which lies within the microwave cavity. This cavity can be attached to a stepping motor which drives it, along with the plasma, back and forth along the tube. As the cavity is swept back and forth, the thin film is deposited on the interior of the tube wall in the plasma region. The plasma can be viewed as a "paint brush" which paints a thin layer on the inside wall of the tube. Because deposition occurs in a very intense plasma, high mass deposition rates can be achieved. This technique is taught in the fiber optics field where a similar process is used to make optical fiber preforms, as disclosed in U.S. Pat. No. 4,145,456 by Kupper et al., the disclosure of which is hereby incorporated by reference.

Obviously, the nature of the thin film being deposited is determined by the precursor materials. Thus, a mixture of $SiCl_4$ and $O_2$ results in a $SiO_2$ film, and a mixture of $TiCl_4$ and $O_2$ in a $TiO_2$ film. Further, multilayer thin films can be built up by changing the precursor materials in an alternating fashion. Thus, an $SiO_2/TiO_2$ multilayer is built by alternatively using $SiCl_4$ plus $O_2$ and $TiCl_4$ plus $O_2$.

One embodiment of the present invention contemplates that after the desired multilayer film is configured, it can be broken loose from the dielectric substrate on which it has been formed by thermal shock or other appropriate means without removing the tube from the vacuum system. The flakes of film material can be swept from the tube by flowing nitrogen or other appropriate gas through its interior whereupon the flakes can be collected by a filter downstream from the exit end of the tube. As such, the process of multilayer film deposition, film removal and flake collection can be repeated using the same tube. The end result is a process which can produce flakes at a high rate in equipment which is relatively inexpensive in comparison to the roll coaters used up to now. Further, preferably, no wet processing is required outside the coater in practicing the present invention.

Referring to FIG. 1, the plasma generating device 7 is preferably a microwave magnetron but could also be an rf or dc generator. Dielectric tube 1 is vacuum sealed by end collars 2 and evacuated by pump 9. When tube 1 passes through microwave cavity 3 to which power is supplied by plasma generator 7, the interaction of the electric field in the cavity with gases 11 emitted into the tube 1 by mass flow controller 6 creates a plasma 4 inside the evacuated tube. Gases 11 entering the tube do not chemically react until reaching the plasma region where they are activated and form film 12 on the tube wall.

Microwave cavity 3 can be attached to a cavity moving device 8 which moves the cavity, and consequently the plasma, back and forth along the tube as indicated by arrows 10. This back and forth motion results in the formation of uniform film 12 deposited along the length of the tube. The thickness of the film deposited per pass is controlled by gas flow 11 and the speed of movement in the direction of arrows 10 of the microwave cavity. Multilayer films, in which the deposited material is changed layer by layer, can be deposited by changing the input gases appropriately.

To illustrate the utility of the present invention further, a multilayered film designed to reflect or absorb the visible part of the spectrum and to transmit light having a wave length between 2 and 4 microns was produced. This consisted of layers of $SiO_2$ alternated with layers of Si. The thickness of each layer was calculated using interference filter design techniques. A typical number of layers might be 30 for such a filter.

To produce such layers, the precursor gases were first chosen. In this instance, $SiH_4$ was employed for fabricating the Si layers and $SiCl_4$ plus $O_2$ was employed for fabricating the $SiO_2$ layers.

In producing a first layer of Si, $SiH_4$ was fed into dielectric tube 1. Dielectric tube 1 consisted of a 1 inch diameter glass tube. The $SiH_4$ gas was fed into the reaction chamber at a flow rate between 100–200 sccm and the nominal microwave power employed to produce the plasma was approximately 1000 watts.

The flow rate and power were maintained substantially constant while the plasma was swept along the tube until a first layer of Si was deposited on the tube walls. The SiH4 flow was then terminated and the flow of SiCl4 and oxygen begun in order to deposit the second layer of SiO2. Flow rates of 100 sccm for SiCl4 and O2, respectively, were employed. This process was repeated until the 30 layer structure was completed.

The thickness of each layer in an optical filter must be controlled typically plus or minus 3% to 10%. In employing the present invention, this can be accomplished in several ways. For example, a simple time-rate technique can be used, since the thickness deposited in one pass of the plasma is proportional to the mass flow of the rate limiting gas and inversely proportional to the speed of the microwave cavity along the tube. Mass flow controllers and stepping motors typically can control these factor to within 1%. Another thickness monitoring technique utilizes a laser beam reflected from the growing film in the tube. For example, for films in tubes transparent to visible light, a Helium Neon laser can be used. The magnitude of the reflection can be used to monitor the thickness of each layer in accordance with techniques well known in the optical coating industry.

Yet a second embodiment of the present invention is illustrated in FIG. 6. In this embodiment the plasma is created by a surface wave launched from one end of the tube by a microwave fed device, as opposed to being created by a standing wave in a cavity. In the latter case the plasma is created inside a cavity, while in the former it is created outside the wave launcher. Such a surface wave device, often called a "Surfatron", is described by Chaker et al. in J. Phys. Letters, 53 L. 71 (1982) and by Marec et al. in Elec. Breakdown and Discharges in Gases, Plenum Pub. Corp. B,347 (1983). It is taught that by using such a device, a film can be deposited on the inside of a tube by varying the length of the plasma column along the tube. This variation is accomplished by varying the power to the stationary launcher. And since deposition occurs only at the front end of the moving column, the deposition region can be swept to and fro along the tube by ramping the input microwave power up and down.

More specifically, dielectric tube 40 is inserted into a surface wave launching device 41 and evacuated by pump 42. This launcher is powered by a microwave generator 53 while precursor gases are fed at control rates into the tube 40 through flow controllers 43 from supply containers 44.

As power from the microwave generator is applied to the surface wave launcher 41, a plasma 45 is struck inside evacuated tube 40. The length 46 of this plasma is increased by increasing the power from the microwave generator. Thus, the end of the plasma can be caused to sweep back and forth along the inside of the tube by varying the microwave power.

Deposition of film 47 occurs as the precursor gas mixture enters the plasma column. For materials of interest, the deposition is complete within a few centimeters of the plasma end, the precursor materials being essentially 100% depleted within this distance. Thus, to coat a layer of, for example, SiO2, a mixture of SiCl4 and O2 can be used as precursor gases. A flow of these gases is started with the microwave power and, as a result, the length of plasma column 46, at minima. As the power of the microwave generator is increased, the length of the plasma is increased in a controlled fashion resulting in the deposition of an SiO2 layer on the inside of the dielectric tube. This process can be repeated until multilayer films are deposited.

In practicing the present invention, it must be understood that several plasma coating configurations In practicing the present invention, it must be understood that several plasma coating configurations can be used. In addition to the embodiments shown in FIGS. 1 and 6, it is contemplated that a pulsed system can be employed. Here, precursors are bled into an evacuated tube until the pressure reaches a predetermined level. The precursor flow is then stopped and a pulsed plasma discharge is initiated throughout the tube. This pulsed discharge typically lasts several milliseconds during which time the precursors in the tube are depleted by deposition of a film on the tube wall, after which product gases are pumped from the system. This process can be repeated until the desired film thickness if reached.

In yet another embodiment, a dielectric cylindrical tube can be inserted in a wave guide, and a simple traveling wave can be used to create a plasma.

Regardless of which embodiment is employed to apply the various film layers, it is contemplated in practice of the present invention that these films be removed from the tubular surfaces in flake form.

Film removal can be accomplished in several ways in accordance with the present invention. For example, film stresses which can be used to remove and flake the film are basically intrinsic and/or thermal in nature. Intrinsic stress arises as the film is deposited at a given temperature. Thermal stress occurs as the film temperature is changed from the deposition temperature and is the result of the usually different thermal expansion coefficients of the multilayered film materials and the substrate. If the combination of intrinsic and thermal stresses in the film is tensive and greater than the adhesive force binding the film to the substrate, the film will crack into plates and flake away from the substrate as desired.

To illustrate the above, an SiO2/TiO2 multilayered film was deposited on the inside of a quartz tube employing the combination of SiCl4 plus O2 and TiCl4 plus O2 as precursor gases. This configuration consisted of 31 layers of alternating SiO2 and TiO2 films providing a total thickness of approximately 2 microns. The deposition temperature was approximately 300° C. and the quartz tube untreated prior to deposition. Upon cooling, it was found that the SiO2/TiO2 multilayer film formed flakes which easily dropped from the substrate's surface. These flakes were readily swept away from the tube by pumping a "sweeping gas" such as nitrogen, through the tube as described below.

It was noted that the film of SiO2/TiO2 exhibited a higher thermal expansion coefficient than the quartz tube onto which it was applied. Thus, cooling after deposition created a tensive stress in the film leading to flaking. If the tube had a higher thermal expansion coefficient than that of the film, tensive forces would be increased by heating the film/tube structure above the deposition temperature.

It has been found that elevating the temperature of the film/tube combination to increase tensive forces can be carried out by creating a plasma of a gas which is incapable of depositing any further film material. For example, nitrogen can be introduced into the reaction chamber in a sufficient quantity to sustain an intense plasma whereupon the microwave power can be increased creating temperatures in excess of 1000° C. This can result in thermal stress sufficient to release and flake the film in a single pass of the plasma generating device.

FIG. 2 illustrates yet another embodiment of the present invention in which a release layer is provided to promote removal of the pigmented film as flakes. In this embodiment, a first layer is deposited on the tubular substrate 13 as release layer 14. Multilayer 15 can then be deposited as provided previously on top the release layer.

The release layer and associated release mechanism can take various forms. For example, Teflon ® can be employed. The plasma polymerization and deposition of Teflon ® are well known. When the temperature of Teflon ® is raised to approximately 350°–400° C., the Teflon ® depolymerizes and/or evaporates, turning from a solid film into a gas. This can be accomplished by employing a slow, high power pass of the microwave plasma generating device down the coated tube, thus depolymerizing the Teflon ® layer and flaking the coating from the tube as desired. The Teflon ® layer need not be very thick to provide adequate release properties. For example, a multilayer infrared emission film might be several microns thick but require only a few tens or hundreds of angstroms of Teflon ® to release efficiently. This small relative thickness of the Teflon ® can ease The requirement for complete polymerization or evaporation, since for most products a small residue of release agent on the flakes is not harmful.

Alternatively, $N_2B_4O_7$ can be employed as the release agent. As previously noted, this material is soluble in water and is employed when one wishes to use a liquid to promote release of the film.

FIG. 3 illustrates yet another embodiment of the present invention whereby multilayers of release agents can be provided, each separating a multilayered film from which flakes are to be made. Turning to FIG. 3, tubular substrate 17 is coated with a first release layer 18 followed by multilayer film 19. This is, in turn, followed by a second release layer 20 and so on until a practical limit of total thickness is reached. The several multilayers are then broken away from the tube and separated from each other in a single release operation.

It is contemplated that if intrinsic and thermal stresses prove inadequate in removing the pigmented films from the dielectric surface, mechanical vibration can be employed to complete the separation. As such, application of a sonic or ultrasonic transducer to the tube has proven a convenient technique for providing such vibration.

As previously noted, upon release of the film in flake form from the tube wall, it is contemplated that a mechanism be provided for removal of the flakes from the tube. Such removal can be efficiently carried out in either of two ways without removing the tube from the vacuum system. The flakes can either be blown out by a gas applied to the interior of the reaction chamber at a pressure greater than atmospheric or, alternatively, they can be pulled from the tube by an appropriately placed vacuum pump. In either case, flake removal can be accomplished without removal of the tube from the vacuum chamber.

FIG. 4 illustrates a first such embodiment depicting a high pressure flake removal system. Flakes are blown from tube 23 by bleeding a gas from high pressure container 24 through control valve 25. The high pressure gas flows through tube 23 containing the flakes and then through another control valve 26 into collection vessel 27. The collection vessel is open to atmospheric pressure through filter 28 located at the top of the vessel. This filter enables high pressure gas to escape while preventing the escape of flakes which are collected at the bottom of vessel 27 when the gas flow is terminated. During deposition of the film, valves 25 and 26 are closed while valve 29 controlling flow from precursor system 30 is open, as is valve 31 in the vacuum pump line.

When film removal from the tube walls requires a plasma, the creation of which can be difficult at atmospheric pressure, a gas, such as nitrogen or argon, can be used to bring the pressure within the chamber to a level which permits ready operation of the plasma. After introduction of the inert gas, all valves to the tube are closed and the film is flaked from the walls using non-flowing gas to sustain the plasma. The system can then be switched from deposition mode to the film removal mode automatically without removing the tube from the system. As such, one can achieve the object of the present invention which includes an efficient technique for removing and collecting the flakes.

FIG. 5 depicts yet another flake removal system, in this case, employing pressures lower than ambient. During flake removal, control valve 32 in a line connecting the tube to a gas supply is open. On the output or pump end of the system, a by-pass valve 34 allows the sweeping gas to be shunted through a collecting chamber 35 equipped with a filter 36 on which the flakes are collected. The sweeping gas is then pumped through the system by a vacuum pump. After collection, the system is changed to the deposition mode in which valves 34 and 32 are closed and valve 37, controlling precursor flow from the deposition gas system 38, and valve 39 are open. While the next film deposition is in process, filter 35 is taken from collection chamber 36 and the collected flakes are removed. This need not be done after every deposition cycle but only as required to keep the filter clear enough to allow pumping during flake removal.

Despite advantages of film and flake removal in situ, the present invention can also be practiced while removing the film and flakes by an off-line process. Thus, a tube can be coated in the system of FIG. 1, removed from the system, and placed in a tube furnace for film flaking, and finally, placed in an apparatus for flake collection. The film and flake removal could even be accomplished by a wet process, although this is not preferred for reasons given earlier.

We claim:

1. A method for producing flakes of films, said method comprising providing a substrate within a chamber, creating a vacuum within the chamber, feeding a gas to the interior of the chamber, said gas being characterized as being capable of forming a plasma upon its exposure to a plasma generating device, creating a plasma within said chamber which, in turn, forms a film upon a surface of said substrate which is thereupon removed from the substrate as flakes which are then extracted from said chamber.

2. The method of claim 1 wherein said plasma is created by bringing said chamber within an electric field having a frequency between zero and one hundred gigahertz.

3. The method of claim 2 wherein said cavity or field is caused to move along said chamber thus creating a plasma at said substrate.

4. The method of claim 1 wherein said substrate comprises a dielectric material configured in the shape of a tube.

5. The method of claim 1 wherein said substrate comprises a glass tube.

6. The method of claim 1 wherein said flakes are approximately 500 angstroms to 30 microns in thickness.

7. A method for providing flakes of films, said method comprising providing a chamber in the shape of a hollow tubular member having inner and outer walls, creating a vacuum within the chamber, feeding a gas to the interior of the chamber, said gas being characterized as being capable of forming a plasma upon its exposure to a plasma generating device, creating a plasma within said chamber which, in turn, forms a film upon the inner walls of said chamber which is thereupon removed from said inner walls as flakes which are then extracted from the chamber.

8. The method of claim 7 wherein said plasma generating device comprises a surface wave launcher.

9. The method of claim 8 where the output of said surface wave launcher is varied to cause said plasma to travel along the inner walls of said chamber.

10. The method of claim 7 wherein said plasma is created by a pulsed discharge throughout said chamber.

11. The method of claim 1 wherein said films are subjected to stress sufficient to cause said films to flake from said substrate.

12. The method of claim 7 wherein said films are subjected to stress sufficient to cause said films to flake from said chamber.

13. The methods of claims 11 or 12 wherein said stress is caused by changing the temperature of said films and of the surfaces on which they are supported.

14. The method of claim 13 wherein said temperature change is created by introducing a second gas into the chamber which is incapable of producing a film deposit when converted to a plasma and transforming said second gas to a plasma.

15. The method of claim 1 wherein a release layer is deposited upon said substrate prior to the deposition of said films.

16. The method of claim 7 wherein a release layer is deposited upon the inner walls of said chamber prior to the deposition of said films.

17. The methods of claims 15 or 16 wherein said release layer comprises Teflon ® which is applied by plasma polymerization.

18. The method of claims 15 or 16 wherein said release layer comprises a film of $N_2B_4O_7$.

19. The methods of claims 15 or 16 wherein one or more additional release layers are applied between subsequently applied layers of films.

20. The method of claims 1 or 7 wherein said flakes are removed from said chambers by a process of blowing said flakes from the chambers by high pressure gas.

21. The method of claims 1 or 7 wherein said flakes are removed from said chambers by a process of bleeding a gas into said chambers while maintaining the pressure in the chambers below ambient pressure.

22. The method of Claims 1 or 7 wherein said flakes are removed from said chamber by mechanical abrasion.

* * * * *